United States Patent [19]
Matsumoto et al.

[11] Patent Number: 5,140,109
[45] Date of Patent: Aug. 18, 1992

[54] CONTAINER PACKAGE FOR SEMICONDUCTOR ELEMENT

[75] Inventors: Hiroshi Matsumoto; Hiroaki Inokuchi, both of Kokubu, Japan

[73] Assignee: Kyocera Corporation, Kyoto, Japan

[21] Appl. No.: 574,470

[22] Filed: Aug. 27, 1990

[30] Foreign Application Priority Data

| Aug. 25, 1989 | [JP] | Japan | 1-219228 |
| Nov. 27, 1989 | [JP] | Japan | 1-308592 |
| Nov. 27, 1989 | [JP] | Japan | 1-308611 |
| Nov. 27, 1989 | [JP] | Japan | 1-308612 |
| Nov. 30, 1989 | [JP] | Japan | 1-312724 |

[51] Int. Cl.$^5$ .......................................... H01L 23/02
[52] U.S. Cl. ................... 174/52.4; 174/50.59; 174/50.61; 357/74; 357/70; 420/8; 420/34; 501/55; 501/60
[58] Field of Search ............... 174/52.1, 52.2, 52.3, 174/52.4, 50.56, 50.59, 50.61; 501/55, 60, 53; 420/8, 15, 34; 437/220; 357/70, 74

[56] References Cited

U.S. PATENT DOCUMENTS

| 4,103,416 | 8/1978 | Sakamoto | 29/630 D |
| 4,262,165 | 4/1981 | Ohwaki et al. | 174/52.4 |
| 4,482,781 | 11/1984 | Burns | 174/52.4 |
| 4,598,307 | 7/1986 | Wakabayashi et al. | 357/75 |
| 4,882,212 | 11/1989 | SinghDeo et al. | 428/76 |
| 4,931,854 | 6/1990 | Yonemasu et al. | 357/74 |
| 4,966,926 | 10/1990 | Donohue | 523/210 |

FOREIGN PATENT DOCUMENTS 0227336 11/1985 Japan .
1108795  4/1989 Japan .

Primary Examiner—Leo P. Picard
Assistant Examiner—Bot Lee Ledynh
Attorney, Agent, or Firm—Spensley Horn Jubas & Lubitz

[57] ABSTRACT

Disclosed is a container package for a semiconductor element, which comprises a vessel having in the interior thereof a space for containing a semiconductor element, which comprises an insulating substrate and a lid member, an external lead terminal for connecting the semiconductor element contained in the vessel to an electric circuit and a sealing agent for sealing the vessel and external lead terminal, wherein the external lead terminal is composed of an electroconductive material having a permeability lower than 210 (CGS) and a thermal expansion coefficient of from $9 \times 10^{-6}$ to $12 \times 10^{-6}$/°C.

3 Claims, 1 Drawing Sheet

CONTAINER PACKAGE FOR SEMICONDUCTOR ELEMENT

BACKGROUND OF THE INVENTION (1) Field of the Invention

The present invention relates to an improvement in a package for containing a semiconductor element.

(2) Description of the Related Art

A conventional package for containing a semiconductor element, especially a glass-sealed semiconductor container package sealed by fusion bonding of a glass, comprises an insulating vessel having in the interior thereof a space for containing a semiconductor element, which comprises an insulating vessel and a lid member, and an external lead terminal for electrically connecting the semiconductor element contained in the vessel to an external electric circuit. In this package, a sealing glass material member is attached to each of confronting main surfaces of the insulating substrate and lid member, the external lead terminal is fixed to the main surface of the insulating substrate, respective electrodes of the semiconductor element are wire-bonded and connected to the external lead terminal, and the glass material members fusion-bonded to the insulating substrate and lid member are melted and integrated to seal the semiconductor element in the interior air-tightly.

In the conventional glass-sealed semiconductor element container package, the external lead terminal is composed of an electroconductive material such as Koval (an alloy comprising 29% by weight of Ni, 16% by weight of Co and 55% by weight of Fe) or 42 Alloy (an alloy comprising 42% by weight of Ni and 58% by weight of Fe), but since Koval or 42 Alloy has a high permeability, Koval or 42 Alloy has a defect as described below.

Namely, Koval or 42 Alloy consists solely of ferromagnetic metals such as iron (Fe), nickel (Ni) and cobalt (Co), and the permeability is as high as 250 to 700 (CGS). Accordingly, if an electric current flows in the external lead terminal composed of Koval or 42 Alloy, a large self-inductance proportional to the permeability is generated in the external terminal and this large self-inductance induces a counter electromotive force as a noise, and this noise is put into he semiconductor element to cause the semiconductor element to make a malfunction.

SUMMARY OF THE INVENTION

The present invention is to overcome the foregoing defects of the conventional technique, and it is a primary object of the present invention to provide a container package for a semiconductor element, in which a noise generated at the external lead terminal is controlled to a minimum level, and the input of the signal into the semiconductor element contained in the interior and the output of the signal therefrom can be performed precisely, whereby the semiconductor element can be operated normally and stably over a long period.

In accordance with the present invention, there is provided a container package for a semiconductor element, which comprises a vessel having in the interior thereof a space for containing a semiconductor element, which comprises an insulating substrate and a lid member, an external lead terminal for connecting the semiconductor element contained in the vessel to an external electric circuit and a scaling agent for sealing the vessel and external lead terminal, wherein the external lead terminal is composed of an electroconductive material having a permeability lower than 210 (CGS) and a thermal expansion coefficient of from $9 \times 10^{-6}$ to $12 \times 10^{-6}/°C$.

DETAILED DESCRIPTION OF THE PREFERRED EMBODIMENTS

Figure 1:
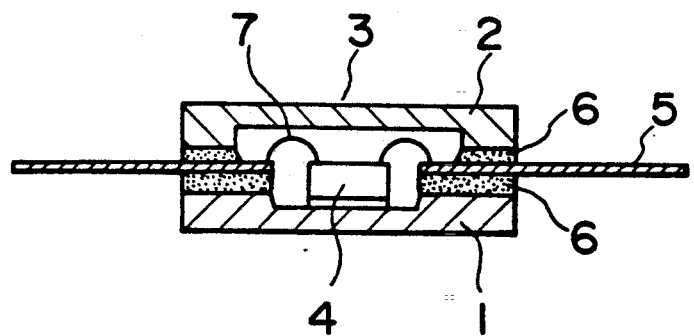
FIG. 1 is a sectional view illustrating one embodiment of the semiconductor element container package of the present invention.
Figure 2:
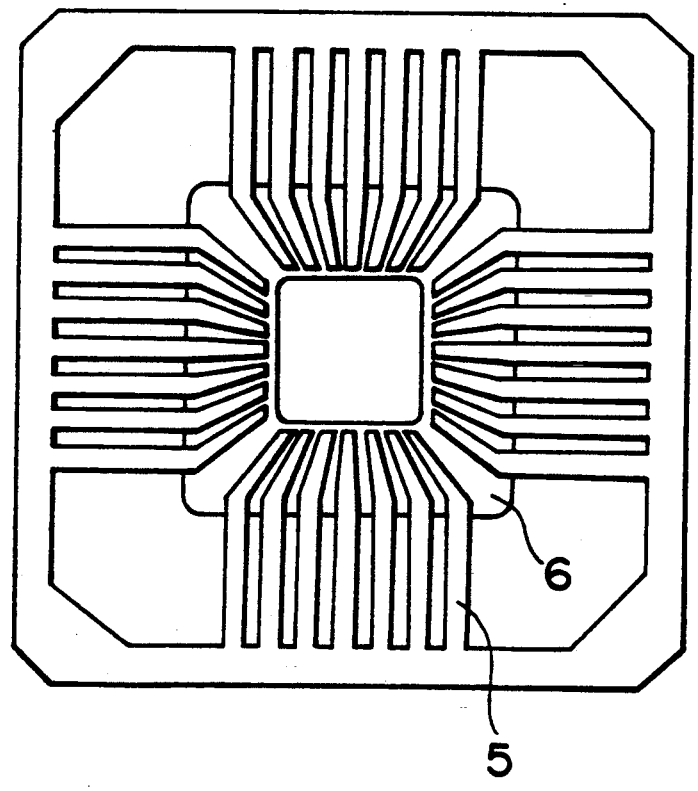
FIG. 2 is a plane view of the package of FIG. 1, seen from the top surface of the insulating substrate.

Referring to FIGS. 1 and 2 illustrating the embodiment of the semiconductor element container package of the present invention, this package comprises an insulating vessel 3 which is constructed by an insulating substrate 1 and a lid member 2.

A recess for forming a space for containing a semiconductor element is formed at a central part of each of the insulating substrate 1 and lid member 2, and a semiconductor element 4 is attached and fixed to the bottom face of the recess of the insulating substrate 1 through an adhesive such as a resin, a glass or a solder.

The insulating substrate 1 and lid member 2 are composed of optional ceramics such as forsterite ceramics and zirconia ceramics, and the substrate 1 and lid member 2 are formed by filling a starting ceramics powder into a press mold having a shape corresponding to the shape of the insulating substrate 1 and lid member 2, applying a predetermined pressure to the filled powder to mold the powder and firing the molded body at a firing temperature inherent to the ceramics used.

The ceramics constituting the insulating substrate 1 and lid member 2 is selected so that no great difference of the thermal expansion coefficient is produced between the insulating substrate 1 and lid member 2 and a sealing glass material member described hereinafter.

A sealing glass material member 6 is bonded to each of the confronting main surfaces of the insulating substrate 1 and lid member 2 in advance, and the sealing glass material members 6 bonded to the insulating substrate 1 and lid member 2 are heated and melted to effect integration, whereby the semiconductor element 4 in the insulating vessel 3 is air-tightly sealed. If the thermal expansion coefficient of the sealing glass material member 6 is made close to that of the insulating substrate 1 and lid member 2, when the semiconductor element 4 in the insulating vessel 3 is air-tightly sealed by heat-melting and integrating the sealing glass material members 6 bonded to the insulating substrate 1 and lid member 2, a thermal stress by the difference of the thermal expansion coefficient between the insulating substrate 1 and lid member 2 and the sealing glass material member 6 is not substantially caused, and the insulating substrate 1 and lid member 2 can be tightly bonded to each other through the sealing glass material member 6.

The sealing glass material member 6 is coated and bonded onto the confronting main surfaces of the insulating substrate 1 and lid member 2, for example, by applying a glass paste formed by adding an appropriate solvent and an appropriate medium to a glass powder such as a powder of a lead borosilicate glass according to a known thick film-forming method.

An external lead terminal 5 composed of an electroconductive material is arranged between the insulating substrate 1 and the lid member 2, and respective electrodes of the semiconductor element 4 are eletrically connected to the external terminal 5 through a wire 7, and the semiconductor element 4 is connected to an external electric circuit by connecting the external lead terminal 5 to the external electric circuit.

When the sealing glass material members 6 coated and bonded to the confronting main surfaces of the insulating substrate 1 and lid member 2 are melted and integrated to seal the insulating vessel 3 air-tightly, the external lead terminal 5 is simultaneously attached between the insulating substrate 1 and lid member 2.

It is important that the external lead terminal 5 should be composed of an electroconductive material having a permeability lower than 210 (CGS), and a thermal expansion coefficient of from $9 \times 10^{-6}$ to $12 \times 10^{-6}/°C$.

Since the permeability of the external lead terminal 5 is low and does not exceed 210 (CGS), even if an electric current flows in the external lead terminal 5, no large self-inductance is generated in the external lead terminal 5, with the result that a noise caused by a counter electromotive force induced by the self-inductance is controlled to a lowest level and the semiconductor element 4 contained in the interior can always be normally operated.

Still further, since the thermal expansion coefficient of the external lead terminal 5 is from $9 \times 10^{-6}$ to $12 \times 10^{-6}/°C$. and is close to that of the sealing glass material member 6, when the external lead terminal 5 is fixed between the insulating substrate 1 and the lid member 2, a stress owing to the difference of the thermal expansion coefficient is not generated between the external lead terminal 5 and the sealing glass material member 6, and therefore, the external lead terminal 5 can be tightly fixed by the sealing glass member material 6.

According to the present invention, the semiconductor element 4 is attached and fixed to the bottom face of the recess of the insulating substrate 1 and respective electrodes of the semiconductor element 4 are connected to the external lead terminal 5 through the bonding wire 7, and then, the insulating substrate 1 and the lid member 2 are bonded to each other by melting and integrating the sealing glass material members 6 coated and bonded in advance to the confronting main surfaces of the insulating substrate 1 and the lid member 2, whereby a semiconductor device as a final product is completed.

External lead terminals preferably used in the present invention and combinations thereof with the substrate and lid member ceramics and the glass sealing agent will now be described in detail.

External Lead Terminal (I)

This terminal is composed of an alloy comprising 24.5 to 25.5% by weight of chromium and 74.5 to 75.5% by weight of iron, and has a permeability of about 1 (CGS) and a thermal expansion coefficient of about $100 \times 10^{-7}$ to $110 \times 10^{-7}/°C$.

In this external lead terminal, if the amounts of chromium (Cr) and iron (Fe) are outside the above-mentioned ranges, the permeability is not reduced to a desirable small value, and the thermal expansion coefficient is not in agreement with that of the insulating substrate and lid member.

As the ceramics suitably combined with the above-mentioned external lead terminal, especially the terminal (I), there can be mentioned a forsterile sintered body and a zirconia sintered body. A sintered body of this type is prepared by filling starting material powders such as magnesia (MgO) and silica ($SiO_2$) in case of the forsterite sintered body or starting material powders such as zirconium oxide ($ZrO_2$) and yttria ($Y_2O_3$) in case of the zirconia sintered body into a press mold having a shape corresponding to the insulating substrate 1 and lid member 2, applying a predetermined pressure to the filled powder and firing the molded body at a temperature of about 1200° to about 1500° C.

The thermal expansion coefficient of the forsterite sintered body or zirconia sintered body constituting the insulating substrate 1 and lid member 2 is $95 \times 10^{-7}$ to $110 \times 10^{-7}/°C$., which is not substantially different from that of the sealing glass material member described below, and therefore, no substantial difference of the thermal expansion is brought about between the insulating substrate 1 and lid member 2 and the sealing glass material member.

The following sealing agents (A), (B) and (C) are preferably used as the member for sealing the above-mentioned terminals and ceramics.

Sealing Agent (A)

This sealing agent consists of a glass formed by adding up to 15% by volume of at least one member selected from the group consisting of lead titanate, eucryptite, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide, and this sealing agent is prepared by weighing and mixing the above components so as to attain a desired composition and heat-melting the powdery mixture at a temperature of 950° to 1100° C. The thermal expansion coefficient of this sealing agent (A) as the glass material member 6 is $90 \times 10^{-7}$ to $120 \times 10^{-7}/°C$. Since this thermal expansion coefficient of the sealing glass material member 6 is approximate to that of the insulating substrate 1 and lid member 2, any thermal stress is not generated.

In this glass, if the content of lead oxide (PbO) is lower than 70.0% by weight, the thermal expansion of the glass becomes small and is not in agreement with that of the insulating substrate 1 and lid member 2. If the content of lead oxide exceeds 90.0% by weight, the chemical resistance of the glass is degrated and the reliability of air-tight sealing of the insulating vessel 3 is drastically reduced.

If the content of boron oxide ($B_2O_3$) is lower than 10.0% by weight, the thermal expansion of the glass becomes large and is not in agreement with the thermal expansion of the insulating substrate 1 and the lid member 2. If the content of boron oxide exceeds 15.0% by weight, the chemical resistance of the glass is degraded and the reliability of air-tight sealing of the insulating vessel 3 is drastically reduced.

If the content of alumina ($Al_2O_3$) is lower than 0.5% by weight, crystallization of the glass is advanced and air-tight sealing of the insulating vessel 3 is difficult, and if the content of alumina exceeds 3.0% by weight, the thermal expansion of the glass is reduced and is not in agreement with the thermal expansion of the insulating substrate 1 and lid member 2.

If the content of silica ($SiO_2$) is lower than 0.5% by weight, crystallization of the glass is advanced and air-tight sealing of the insulating vessel 3 is difficult, and if the content of silica exceeds 0.3% by weight, when the external lead terminal 5 is attached to the insulating vessel 3 through the glass material member 6, the melting temperature of the glass is elevated, and thermal deterioration of the semiconductor element contained in the insulating vessel 3 is caused.

If the content of zinc oxide (ZnO) is higher than 3.0% by weight, crystallization of the glass is advanced and air-tight sealing of the insulating vessel 3 is difficult.

If the content of bismuth oxide ($Bi_2O_3$) is higher than 3.0% by weight, the chemical resistance of the glass is degraded and the reliability of air-tight sealing of the insulating vessel 3 is drastically reduced.

If the amount of at least one member selected from the group consisting of lead titanate ($PbTiO_3$), eucryptite ($LiAl_2Si_2O_8$), cordierite ($Mg_2Al_4Si_5O_{18}$), zircon ($ZrSiO_4$), tin oxide ($SnO_2$), willemite ($Zn_2SiO_4$) and tin titanate ($Sn_4SiO_4$), which is added as the filler, exceeds 15% by volume, the thermal expansion is not in agreement with the thermal expansion of the insulating substrate 1 and the lid member 2.

Sealing Agent (B)

This sealing agent consists of a glass comprising 30.0 to 60.0% by weight of silica, 20.0 to 40.0% by weight of lead oxide and 10.0 to 20.0% by weight of at least one member selected from the group consisting of oxides of sodium and potassium. The sealing agent (B) is prepared by weighing and mixing the foregoing components so as to attain a desired composition and heat-melting the powdery mixture at a temperature of 1300° to 1400° C. The thermal expansion coefficient of this glass material member is $110 \times 10^{-7}$ to $130 \times 10^{-7}$/°C. Since this thermal expansion coefficient is approximate to the thermal expansion coefficient of the above-mentioned ceramics, no thermal stress is generated.

If the content of silica ($SiO_2$) in this sealing glass material is lower than 30.0% by weight, crystallization of the glass is advanced and air-tight sealing of the insulating vessel 3 is difficult. If the content of silica exceeds 60.0% by weight, the thermal expansion of the glass is reduced and is not in agreement with the insulating substrate 1 and lid member 2.

In this glass, if the content of lead oxide (PbO) is lower than 20.0% by weight, the thermal expansion of the glass becomes small and is not in agreement with that of the insulating substrate 1 and lid member 2. If the content of lead oxide exceeds 40.0% by weight, crystallization of the glass is advanced and air-tight sealing of the insulating vessel 3 is difficult.

If the content of the oxide of the sodium or potassium is lower than 10.0% by weight, when the glass is prepared, the melting temperature is drastically elevated and the operation adaptability is drastically degraded. If the content of the oxide of sodium or potassium exceeds 20.0% by weight, the chemical resistance of the glass is degraded and the reliability of air-tight sealing of the insulating vessel 3 is drastically reduced.

Sealing Agent (C)

This sealing agent consists of n glass comprising 60.0 to 70.0% by weight of silica, 10.0 to 20.0% by weight of at least one member selected from the group consisting of oxides of sodium and potassium and 5.50 to 15.0% by weight of borium oxide. The sealing agent (C) is prepared by weighing and mixing the foregoing components so as to attain a desired composition and heat-melting the powdery mixture at a temperature of 1300° to 1400° C. The thermal expansion coefficient of this glass material member is $9 \times 10^{-7}$ to $100 \times 10^{-7}$/°C. Since this thermal expansion coefficient is approximate to the thermal expansion coefficient of the above-mentioned ceramics, no thermal stress is generated.

If the content of silica ($SiO_2$) in this sealing glass material is lower than 60.0% by weight, crystallization of the glass is advanced and air-tight sealing of the insulating vessel 3 is difficult. If the content of silica exceeds 70.0% by weight, the thermal expansion of the glass is reduced and is not in agreement with the insulating substrate 1 and lid member 2.

If the content of the oxide of sodium or potassium is lower than 10.0% by weight, when the glass is prepared, the melting temperature is drastically elevated and the operation adaptability is drastically degraded. If the content of the oxide of sodium or potassium exceeds 20.0% by weight, the chemical resistance of the glass is degraded and the reliability of air-tight sealing of the insulating vessel 3 is drastically reduced.

If the content of barium oxide (BaO) is lower than 5.0% by weight, the chemical resistance of the glass is degraded and the reliability of air-tight sealing of the insulation vessel is drastically reduced. If the content of barium oxide exceeds 15.0% by weight, crystalization of the glass is advanced and air-tight sealing of the insulating vessel is difficult.

In the semiconductor element container package of the present ivention, by forming an external lead terminal for connecting a semiconductor element to an external circuit by using an electroconductive material having a permeability lower than 210 (CGS) and a thermal expansion coefficient of $9 \times 10^{-6}$ to $12 \times 10^{-6}$/°C., generation of a large self-inductance in the external lead terminal can be prevented even if an electric current is caused to flow in the external lead terminal, and therefore, a noise caused by a counter electromotive force induced by the self-inductance can be minimized and the semiconductor element contained in the interior can always be normally operated.

Still further, since the thermal expansion coefficient of the external lead terminal is close to those of the insulating substrate, lid member and sealing glass material member, even if the external lead terminal is gripped between the insulating substrate and lid member and they are bonded together through the sealing glass material member, any thermal stress is generated between the insulating substrate and lid member and the sealing glass material member or between the external lead terminal and the sealing glass material member, and these members can be tightly attached and bonded to one another.

We claim:

1. A container package for a semiconductor element, comprising a vessel having in the interior thereof a space for containing the semiconductor element, the vessel comprising an insulating substrate, a lid member, an external lead terminal for connecting the semiconductor element contained in the vessel to an electric circuit and a sealing agent for sealing the vessel and the external lead terminal, wherein the external lead terminal is composed of an electroconductive material having a permeability lower than 210 (CGS) and a thermal expansion coefficient of from $9 \times 10^{-6}$ to $12 \times 10^{-6}$/°C., and wherein the substrate and the lid member are composed of a forsterite sintered body or a zirconia sintered body, and the sealing agent consists of a glass comprising 30.0 to 60.0% by weight of silica, 20.0 to 40.0% by weight of lead oxide, and 10.0 to 20.0% by weight of at least one member selected from the group consisting of oxides of sodium and potassium.

2. A container package as set forth in claim 1, wherein the external lead terminal is composed of a metal body of an alloy comprising 24.5 to 25.5% by weight of chromium and 74.5 to 75.5% by weight of iron.

3. A container package as set forth in claim 1, wherein the sintered body has a thermal expansion coefficient of from $95 \times 10^{-7}$ to $110 \times 10^{-7}/°C$.

* * * * *